United States Patent [19]

Fitzsimmons et al.

[11] 3,743,967

[45] July 3, 1973

[54] STABILIZED TRAPATT OSCILLATOR DIODE

[75] Inventors: George Washington Fitzsimmons, Lynnwood; Wen Shuh Chen, Seattle, both of Wash.

[73] Assignee: The Boeing Company, Seattle, Wash.

[22] Filed: Mar. 16, 1972

[21] Appl. No.: 235,147

[52] U.S. Cl. ..... 331/107 R, 317/235 K, 317/235 T, 330/5, 330/34, 330/53, 330/61 A

[51] Int. Cl. ..... H03b 7/06, H03f 3/10

[58] Field of Search ..... 330/5, 34, 53, 61 A; 317/234 V, 235 K, 235 T; 331/107 R

[56] References Cited

UNITED STATES PATENTS

| | | | |
|---|---|---|---|
| 3,493,821 | 2/1970 | Bittmann et al. | 331/107 R X |
| 3,588,735 | 6/1971 | Chang et al. | 330/5 X |
| 3,612,914 | 10/1971 | Evans | 331/107 R X |

*Primary Examiner*—Roy Lake
*Assistant Examiner*—Siegfried H. Grimm
*Attorney*—T. H. Murray et al.

[57] ABSTRACT

An avalanche diode having a P+NN+ or N+PP+ doping profile and operable in the TRAPATT mode, but wherein the impurity profile of the device is such as to prevent initiation of TRAPATT oscillations by IMPATT oscillations. In contrast to prior art TRAPATT devices, the diode is inherently stable since the IMPATT mechanism results in only a small internal negative resistance which is effectively canceled by the positive diode bulk resistance, spreading resistance of the device and external circuit resistance.

7 Claims, 5 Drawing Figures

STABILIZED TRAPATT OSCILLATOR DIODE

BACKGROUND OF THE INVENTION

It is known that a P-N junction in a semiconductor element biased in reverse and mounted in a microwave resonant cavity can initiate oscillations at microwave frequencies caused by avalanche breakdown. Several distinctive modes of operation occur within the broad category of avalanche diodes. One of these modes is called the IMPATT mode which is an abbreviation for "impact avalanche transit time." IMPATT operation involves two basic properties of carrier transport in solids at high electric fields. The first of these is that property of a thin avalanche zone that results in a continuing exponential increase of local carrier population as long as a certain electric field is exceeded. The second effect required for IMPATT operation is that of transit-time delay. Contrary to charge motion in a vacuum, carrier velocities in semiconductors rapidly saturate at modest values of electric field. This means that as long as the fields in an IMPATT device are in the range at which carrier velocities saturate, a given length of the device has a unique transit time. Consequently, by adjusting the length of the drift regions outside the avalanche zone, arbitrary amounts of delay can be obtained. The duration of this delay is inversely proportional to the optimum frequency of IMPATT operation.

The term TRAPATT is an abbreviation for "trapped plasma avalanche triggered transit." In this mode of operation, high efficiencies can be obtained at sub-IMPATT frequencies. The mode of operation in conventional TRAPATT diodes is such that initially some number of IMPATT cycles occur, these cycles comprising transit-time oscillations in the usual sense. Then, when the amplitude of the radio-frequency IMPATT voltage reaches a critical value on a given cycle of the IMPATT oscillations, a traveling avalanche zone is launched through the diode, filling it with space-charge neutral hole electron plasma, in a time less than that required for a carrier to cross the diode moving at saturated velocity.

The TRAPATT mode of operation assumes a large launching voltage, well in excess of the breakdown voltage required by the IMPATT cycle. The zone is then driven through the diode provided its external circuit can supply the necessary current. Since large numbers of carriers are created at the peak values of electric field, the field is reduced to a very low value in the wake of the zone. The passage of the zone thus reduces the diode voltage to near zero and the dense plasma created allows a high current low-voltage state. The extraction of this charge now proceeds and the diode recovers to a high voltage low-current state.

TRAPATT operation, therefore, normally requires pumping IMPATT oscillations in order to initiate operation. That is, in conventional TRAPATT diode designs, the diodes exhibit a negative resistance, when biased into reverse breakdown, which gives rise to an oscillation at an IMPATT frequency. Then this IMPATT oscillation triggers the TRAPATT mode of oscillation. Since the normal IMPATT negative resistance for a conventional TRAPATT diode extends over an octave in frequency, it is very difficult to stabilize such a diode for amplifier operation. That is, with the application of an appropriate direct current bias, the diode is likely to oscillate freely.

SUMMARY OF THE INVENTION

In accordance with the present invention, an avalanche diode operable in the TRAPATT mode is provided in which the impurity profile is modified in order to prevent IMPATT oscillations. With this arrangement, TRAPATT oscillations cannot be initiated by IMPATT oscillations since no net negative resistance results at frequencies corresponding to the IMPATT mode of operation. As a result, the diode becomes stable and can be periodically triggered into operation at a given TRAPATT frequency.

Specifically, there is provided in accordance with the invention a semiconductive body having a region of one type conductivity and low resistivity, a region of the other type conductivity and low resistivity, and a drift region between the first-mentioned regions having a higher resistivity of such value that the IMPATT mechanism results in only a small internal nega-tive resistance which is effectively cancelled by the positive diode bulk resistance, the spreading resistance and the external circuit resistance.

The above and other objects and features of the invention will become apparent from the following detailed description taken in connection with the accompanying drawings which form a part of this specification, and in which.

Figures 1, 2A, 2B, 2C, 3:
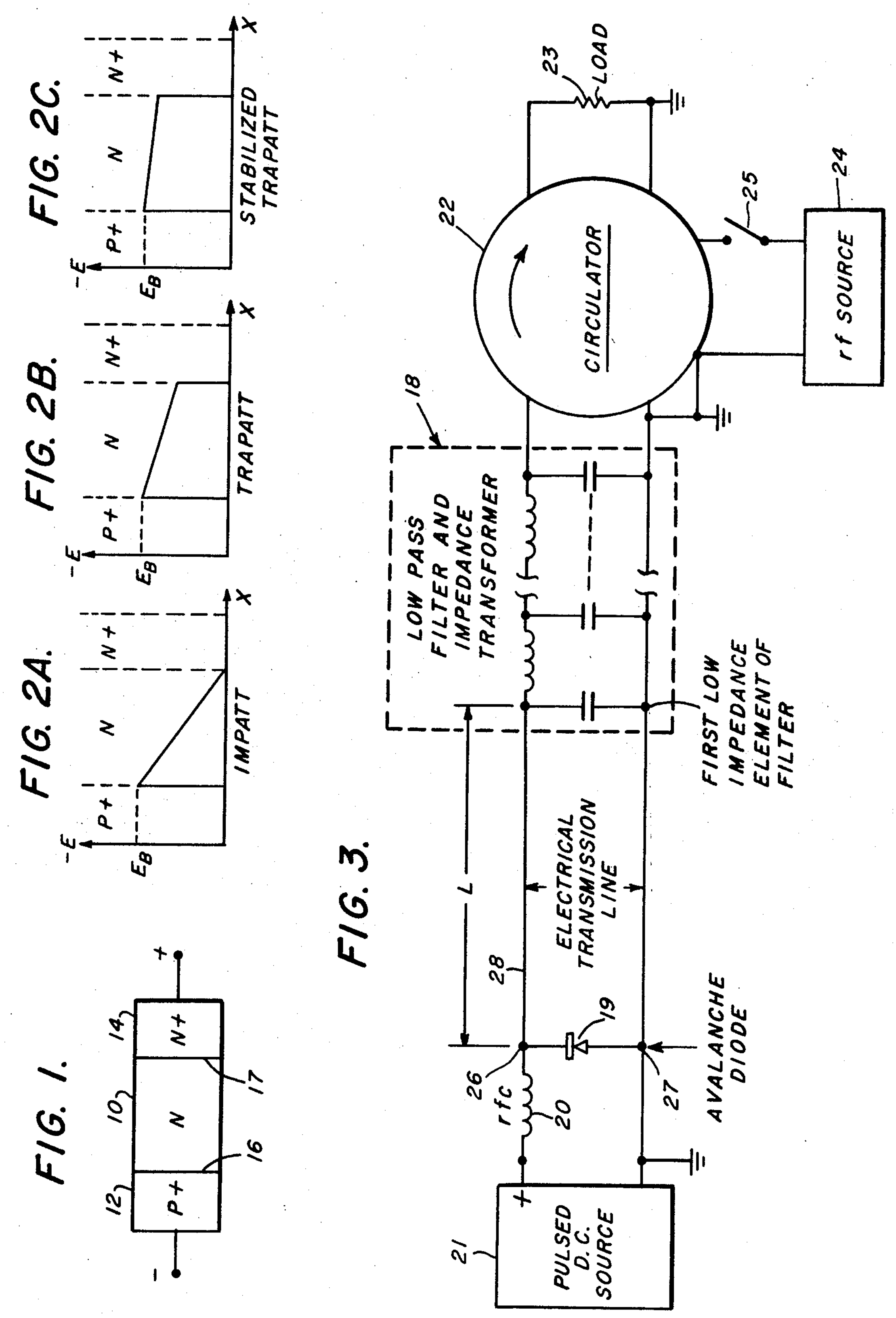
FIG. 1 is a schematic cross-sectional view of the modified TRAPATT oscillator diode of the invention.
FIGS. 2A, 2B and 2C illustrate the negative of the electric field profiles for an IMPATT diode, a conventional TRAPATT diode, and the stabilized TRAPATT diode of the invention, respectively.
FIG. 3 is a schematic circuit illustration of one manner in which the diode of the invention may be used.

With reference now to the drawings, and particularly to FIG. 1, the avalanche diode shown is of the P+NN+ type; although it could also be of the N+PP+ type. The comments which follow regarding the operation and theory of such a device apply to both types of diodes. Thus, there is an intermediate N region 10 bounded by a P+ region 12 on one side and an N+ region 14 on the other side. If a reverse bias is applied to the diode such that the P+ region 12 is negative with respect to the N+ region 14 as shown in FIG. 1, electrons will accumulate at the P+N junction 16. As the voltage across the diode and the electric field is increased, "punch-through" occurs wherein the intermediate region 10 is essentially depleted of free electrons; and this intermediate region containing fixed positive charges now appears as a capacitor. As the voltage rises further, and the field exceeds a critical value $E_B$, electron-hole pairs are created by impact ionization in those regions where the electric field exceeds $E_B$. If an abrupt increasing voltage is applied which rises rapidly above $E_B$, the peak of the E field maximum will move toward the NN+ junction 17 at a wave velocity that exceeds the particle velocity. A dense hole-electron plasma results in the wake of the traveling E-field maximum. This plasma initially has charge neutrality since equal numbers of holes and electrons are generated. It is very conductive, however, and unable to support an electric field substantially above that arising from the normal trapped charges of the diode when reversed biased.

Since the generated electrons drift in the same direction as the wave, while holes drift in the opposite direction, the density of electrons within the right half of the N region 10 is higher than the density of holes. This creates an electron-rich region that serves to further reduce the field. If a sufficient number of electrons is generated, the slope of the field profile reverses and the field reaches a very low value. At low fields, the electrons and holes are slowed, leading to a long extraction period for the removal of the dense plasma. Thus, we see that the TRAPATT mode may result if a sufficiently large over voltage is applied in a short enough period of time. This large voltage serves to fill the diode N region 10 with a dense electron-hole plasma in a very short period of time. The diode terminal voltage drops to a low value due to the large conductance of the plasma and in a time period that might correspond to one-half cycle at the output frequency, the plasma is removed returning the diode to the depleted state.

As was explained above, two distinctive modes of operation of avalanche diodes have been observed. Transit-time mode oscillations (IMPATT) are observed at lower current levels, while the TRAPATT oscillations set in at higher current densities. Furthermore, transit-time oscillations or IMPATT oscillations are normally considered necessary to initiate the anomalous-mode TRAPATT oscillations. At the same time, and as explained above, the normal IMPATT negative resistance for the conventional TRAPATT diode extends over an octave in frequency, meaning that it is very difficult to stabilize such a diode for triggered amplifier operation.

By properly controlling the diode impurity profile (i.e., light doping of the central region 10 in FIG. 1), the net real part of the impedance presented by the diode under various avalanche currents can remain positive and, hence, be unconditionally stable regardless of the diode external circuit. The diode of this invention has such an impurity profile.

For conventional IMPATT avalanche diodes, with either P+NN+ or N+PP+ impurity profiles, the N or P doping density is maintained low enough to insure complete N or P region depletion (punch-through) at a reverse voltage sufficient to cause avalanche breakdown. If punch-through occurs just prior to avalanche breakdown, the electric field profile is as shown in FIG. 2A. Such a device will produce a relatively large usable negative resistance suitable for IMPATT oscillations when biased into avalanche breakdown due to the localization of the avalanche carried generation mechanism to a specific high field region and the provision for a lower field (non-avalanching) drift region throughout the remainder of the diode depletion region.

The conventional TRAPATT diode electric field profile is depicted in FIG. 2B. This diode will also oscillate, exhibiting a net negative resistance in the IMPATT mode, although with considerably less efficiency than diodes having the electric field profile of FIG. 2A. For most applications to date, such IMPATT oscillations have been used to initiate the desired higher powered, higher efficiency TRAPATT mode of oscillation.

The electric field profile for the diode of the invention is illustrated in FIG. 2C. The diode is inherently stable since the IMPATT mechanism results in only a small internal negative resistance which is effectively cancelled by the positive bulk resistance, the spreading resistance and external circuit resistance. That is, TRAPATT oscillations cannot be initiated by IMPATT oscillations since no net negative resistance results at frequencies corresponding to the IMPATT mode of operation. Instead of varying the impurity profile of the diode to control the IMPATT negative resistance, it is also possible to introduce a resistance or other loss mechanism to stabilize the diode. However, this approach usually introduces unnecessary losses at the TRAPATT frequency and is not deemed as being practical. Since the TRAPATT oscillations will not now be triggered by the IMPATT oscillations, initiation of the avalanche shock front required for TRAPATT oscillations can now be provided in a controlled manner by external means, such as an incoming radio-frequency signal, which will initiate phase-lock and result in oscillations in a triggered amplifier configuration with an overall gain.

As a specific example of the invention, the P+ and N+ regions 12 and 14 may have an impurity concentration of about $10^{18}$ atoms per cubic centimeter while the intermediate N-type region 10 has an impurity concentration of $2 \times 10^{15}$ atoms per cubic centimeter. With such an impurity concentration, the resistivity of the intermediate region is about 2.5 ohm centimeters, too low to support the IMPATT oscillations. The thickness of the intermediate region is about 2.8 microns; punch-through occurs at 13 volts; while the breakdown voltage is 90 volts.

A specific circuit using the diode of the invention is shown in FIG. 3, it being understood that the wired circuit with lumped elements as shown was actually achieved with distributed circuit elements. For example, the low pass filter and transformer 18 was actually achieved by cascading an arrangement of low impedance sections in a coaxial transmission line. The circuit of FIG. 3 may also be achieved in waveguide.

The avalanche diode 19 is mounted in shunt with a co-axial transmission line and receives pulsed direct current bias through radio frequency choke 20 which passes direct current but is a high impedance to radio frequency signals. The direct current bias is provided by power supply 21 which is adjustable up to and beyond avalanche breakdown or above 90 volts in the example given above. A pulsed source was employed to avoid over-heating the diode which was not designed for continuous operation.

The low pass filter 18 has a cut-off frequency just above the desired output frequency which traps the harmonic components of the signal and prevents energy loss at said harmonics. The impedance transformer incorporated within the low pass filter 18 is used to transform the circulator 22 and signal load 23 impedance to that desired by the diode at the signal frequency for maximum power output. For the specific example described here, the circulator 22 and load 23 were standard 50 ohm components and a 2:1 transformation was employed to match the diode impedance at the signal frequency which was approximately −25 ohms. The diode signal impedance is a function of the diode cross-sectional area and may be changed as desired.

For this particular example, the diode was placed a distance L which was slightly less than one-half wavelength at the signal frequency from the closest edge of the first low impedance section of the low pass filter and impedance transformer 18. In this manner, once oscillations were initiated, they would be self sustaining for the remainder of the time that the direct current bias pulse was applied. If one wishes the device to behave more as a true amplifier wherein the output signal disappears whenever the input signal is removed, L should be selected differently. In order to prevent self triggering by the traveling shock wave initiated by the diode's sudden change to the low impedance state which returns as a high voltage pulse approximately one cycle later, the dimension L should be reduced to a small value compared to the desired operating wavelength.

A source of radio-frequency energy 24 is adapted to be applied to the diode through the circulator 22 which is a non-reciprocal device which separates the diode incoming radio-frequency energy from any outgoing radio-frequency energy. In the operation of the invention, the bias voltage applied via terminals 26 and 27 is increased above the avalanche breakdown $E_B$. Because of the impurity profile of the diode, IMPATT oscillations do not occur, nor will an increase in applied field initiate TRAPATT oscillations. However, by closing switch 25 and applying radio-frequency energy across the diode terminals 26 and 27, TRAPATT oscillations can be initiated giving rise to triggered amplifier operation. Although radio-frequency energy was used in this example to initiate TRAPATT oscillations, one could also initiate such oscillations by applying a fast rising direct current pulse to terminals 26 and 27.

Although the invention has been shown and described in connection with certain specific embodiments, it will be readily apparent to those skilled in the art that various changes in form and arrangement of parts may be made to suit requirements without departing from the spirit and scope of the invention.

We claim as our invention:

1. In an avalanche diode, the combination of a semiconductive body having a first region of one type conductivity, a second region of the other type conductivity, and a drift region intermediate the first and second regions and of lower impurity concentration than said first and second regions, said diode being operable in the TRAPATT mode but having an impurity profile such that no net negative resistance results at frequencies corresponding to the IMPATT mode of operation, whereby TRAPATT oscillations cannot be initiated by IMPATT oscillations but must be initiated by an external trigger source.

2. The combination of claim 1 wherein said diode has a P+NN+ impurity concentration.

3. The combination of claim 1 wherein said diode has an N+PP+ impurity profile.

4. The combination of claim 1 wherein said first and second regions have an impurity concentration of about $10^{18}$ atoms per cubic centimeter while said intermediate region which is 2.8 microns wide has a dopant concentration of about $2 \times 10^{15}$ atoms per cubic centimeter.

5. The combination of claim 1 wherein said external trigger source comprises a source of radio-frequency energy having terminals adapted to be connected to said first and second regions through a non reciprocal element.

6. The combination of claim 5 wherein said non reciprocal element comprises circulator means.

7. The combination of claim 1 wherein said external trigger source comprises a source of transient direct current energy having terminals adapted to be connected to said first and second regions through a switch.

* * * * *